US 11,988,637 B2

(12) United States Patent
Zheng et al.

(10) Patent No.: US 11,988,637 B2
(45) Date of Patent: May 21, 2024

(54) NON-DESTRUCTIVE TESTING DEVICE FOR DETECTING DAMAGE TO STEEL WIRE ROPE (71) Applicant: MultiDimension Technology Co., Ltd., Zhangjiagang (CN)

(72) Inventors: Kuohai Zheng, Zhangjiagang (CN); Junyong Li, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 510 days.

(21) Appl. No.: 17/278,037

(22) PCT Filed: Sep. 17, 2019

(86) PCT No.: PCT/CN2019/106138
§ 371 (c)(1),
(2) Date: Mar. 19, 2021

(87) PCT Pub. No.: WO2020/057491
PCT Pub. Date: Mar. 26, 2020

(65) Prior Publication Data
US 2021/0382007 A1 Dec. 9, 2021

(30) Foreign Application Priority Data
Sep. 20, 2018 (CN) .......................... 201821540838.X (51) Int. Cl.
*G01N 27/82* (2006.01)
*G01R 33/00* (2006.01)

(52) U.S. Cl.
CPC ......... *G01N 27/82* (2013.01); *G01R 33/0047* (2013.01); *G01R 33/0094* (2013.01)

(58) Field of Classification Search
CPC .... G01N 27/82; G01N 27/83; G01R 33/0047; G01R 33/0094
See application file for complete search history.

(56) References Cited

U.S. PATENT DOCUMENTS 5,564,747 A * 10/1996 Ono .................. B60R 22/46
102/272

FOREIGN PATENT DOCUMENTS

| CN | 2033122 U | | 2/1989 | |
| CN | 202837240 U | * | 3/2013 | ............. G01N 27/83 |

(Continued)

OTHER PUBLICATIONS

"International Application No. PCT/CN2019/106138, International Search Report and Written Opinion dated Jan. 8, 2020", (Jan. 8, 2020), 15 pgs.

(Continued)

*Primary Examiner* — Tung S Lau
(74) *Attorney, Agent, or Firm* — Schwegman Lundberg & Woessner, P.A.

(57) ABSTRACT

A non-destructive testing device for detecting damage to a steel wire rope, including a bushing which limits a lower shell and an upper shell through a limiting groove. The lower shell is connected to the upper shell via an opening and closing structure. An air bag is wrapped around the bushing. A PCB is fixed on the upper shell or the lower shell. The PCB is connected to a guide wheel via an electrical connector. A magnetoresistive sensor array is arranged inside the air bag and is uniformly arranged in a circumferential direction of the bushing. A steel wire rope passes through the magnetoresistive sensor array. And when the steel wire rope moves, it drives the guide wheel to rotate and triggers the acquisition of a command. Guide wheel is set with a position coder which is used to calculate a relative position of movement of the steel wire rope. The PCB is connected to a single chip microcomputer via a peripheral interface. And the single chip microcomputer is used to calculate a differential signal of N adjacent magnetoresistive sensors and to determine whether the steel wire rope is damaged. The (Continued)

capability of this non-destructive testing device for detection of a broken wire, a narrowed diameter, and deep damage of the steel wire rope is improved.

7 Claims, 4 Drawing Sheets

(56)  References Cited

FOREIGN PATENT DOCUMENTS

| | | | | |
|---|---|---|---|---|
| CN | 103760222 A | | 4/2014 | |
| CN | 205280657 U | | 6/2016 | |
| CN | 106324080 A | * | 1/2017 | ............... D07B 7/16 |
| CN | 206505041 U | * | 9/2017 | ............. G01N 27/83 |
| CN | 208833707 U | | 5/2019 | |
| EP | 0845672 A1 | | 6/1998 | |
| JP | 2005195472 A | | 7/2005 | |
| JP | 6373471 B1 | | 7/2018 | |
| WO | WO 2016119331 A1 | * | 8/2016 | ............... G01N 3/38 |
| WO | WO-2020057491 A1 | | 3/2020 | |

OTHER PUBLICATIONS

Chen, Hougui, et al., "Research on In service crack monitoring system of shaped wire with leakage magnetic field technology", Nondestructive Testing, vol. 26, No. 08, Aug. 10, 2004 (Aug. 10, 2004), pp. 399-401 [abstract only], (Aug. 10, 2004), 399-401.
Wang, Junfeng, et al., "Non destructive testing method and apparatus for wire rope", Construction Machinery, No. 01, Jan. 9, 1995, pp. 21-25 [abstract only], (Jan. 9, 1995), 21-25.

* cited by examiner

NON-DESTRUCTIVE TESTING DEVICE FOR DETECTING DAMAGE TO STEEL WIRE ROPE

PRIORITY CLAIM TO RELATED APPLICATIONS

This application is a U.S. national stage filing under 35 U.S.C. § 371 from International Application No. PCT/CN2019/106138, filed on 17 Sep. 2019, and published as WO2020/057491 on 26 Mar. 2020, which claims the benefit under 35 U.S.C. 119 to Chinese Application No. 201821540838.X, filed on 20 Sep. 2018, the benefit of priority of each of which is claimed herein, and which applications and publication are hereby incorporated herein by reference in their entirety.

TECHNICAL FIELD

The present invention relates to the field of electromagnetic non-destructive testing, and in particular, to a non-destructive testing device for detecting damage to a steel wire rope.

BACKGROUND

Non-destructive testing of steel wire ropes is a procedure used to check the status of steel wire ropes of public transportation facilities (cableways, freight ropeways, chair lifts, ski lifts, etc.) or equipment (cargo lifts, cranes, forklifts, etc.). Regular non-destructive testing is performed to prevent deterioration of the steel wire ropes, which may be caused by many factors: steel wire rope fracture due to fatigue or abnormal scratching, corrosion, abnormal distribution of tension due to manufacturing or assembly defects, etc.

Due to high dynamic load and overload bearing capacity, steel wire ropes are mainly used in various lifting and transportation equipment, mechanical transmission devices, ship traction mechanisms, bridge erecting machinery, and other occasions that require traction, hoisting, and tensioning and fixing. Electromagnetic non-destructive testing is currently the most commonly used method for detecting damage to a steel wire rope. A steel wire is magnetically excited by an excitation unit (permanent magnet excitation or eddy current excitation), and a magnetic sensor is used to detect the leakage magnetic field at a damaged part of the steel wire rope to evaluate the damage state of the steel wire rope. Disadvantages of this detection method lie in that: for achieving internal damage detection of a steel wire rope, it is necessary to increase the excitation field to increase the strength of the leakage magnetic field, which needs to increase the dynamic range of the magnetic sensor to prevent magnetic saturation, but reduces the magnetic field sensitivity of the magnetic sensor, thereby reducing the detection effect. The other method is to increase the sensitivity of the magnetic sensor and use a lower excitation field for excitation, but the adopted magnetic sensor has an insufficient spatial resolution, and the reproducibility of the detection results is poor. At the same time, the two detection methods both compare detection data with reference signals to determine the damage, and a standard test block is needed in the detection process, or a relatively intact part of the steel wire rope to be tested is selected as the reference.

SUMMARY OF THE INVENTION

In order to solve the above technical problems, a non-destructive testing device for detecting damage to a steel wire rope is proposed in the present invention. The present invention utilizes magnetic memory of the steel wire rope formed during use for real-time detection, does not require an excitation structure and a reference, and is convenient to operate.

The present invention is implemented according to the following technical solutions:
a non-destructive testing device for detecting damage to a steel wire rope, including: a lower shell, a bushing, an upper shell, an electrical connector, an air bag, a PCB, and a guide wheel, wherein
the bushing limits the lower shell and the upper shell through a limiting groove, the lower shell is connected to the upper shell via an opening and closing structure, the air bag is wrapped around the bushing, the PCB is fixed on the upper shell or the lower shell, and the PCB is connected to the guide wheel through the electrical connector;
a magnetoresistive sensor array composed of N magnetoresistive sensors is arranged inside the air bag and is uniformly arranged in a circumferential direction of the bushing, a steel wire rope passes through the magnetoresistive sensor array, and when the steel wire rope moves, it drives the guide wheel to rotate and triggers the acquisition of a command;
the guide wheel is set with a position coder which is used to calculate a relative position of movement of the steel wire rope; and
the PCB is connected to a single chip microcomputer via a peripheral interface, and the single chip microcomputer is used to calculate a differential signal of N adjacent magnetoresistive sensors and to determine whether the steel wire rope is damaged.

Further, the opening and closing structure includes a buckle and a hinge;
first connecting parts of the lower shell and the upper shell are connected via the buckle, and second connecting parts of the lower shell and the upper shell are connected via the hinge; and the buckle and the hinge are respectively fixed on the lower shell and the upper shell by countersunk screws.

Further, the PCB is fixed on the upper shell or the lower shell by pan-head screws through metalized through holes;
the PCB is connected to the electrical connector via a twisted-pair cable, the guide wheel is connected to the electrical connector via a twisted-pair shielded cable, and a shielding layer of the twisted-pair shielded cable is connected to the upper shell through pins of the electrical connector.

Preferably, at least two sets of reeds are further included, each set of reeds is uniformly distributed along an inner surface of the bushing in the circumferential direction, one end of the reed is welded to the inner surface of the bushing, and the other end of the reeds is embedded in a groove opened on the inner surface of the bushing.

Preferably, each set of reeds contains at least two reeds, and distances between adjacent sets of reeds in an axial direction of the inner surface of the bushing are the same.

Preferably, the bushing is set with a plurality of positioning columns, the air bag is set with positioning holes corresponding to the positioning columns, and the positioning columns are inserted into the positioning holes.

Preferably, the PCB is integrated with a multiplexer and is used to output, via the multiplexer and in a preset order, information acquired by the magnetoresistive sensor array.

Compared with the prior art, the present invention has the following beneficial technical effects.

1. The present invention utilizes the magnetic memory characteristic of the steel wire rope to simplify the excitation structure. The present invention can improve the miniaturization and portability of the detection device, and is easier to popularize; it utilizes the memory effect of the natural magnetic field of the earth on the magnetization of the steel wire rope, and adopts a magnetoresistive sensor as the magnetic sensing unit to measure the magnetic field gradient information around the steel wire rope without excitation. It is simple in structure, convenient in operation, high in defect resolution, and easy in data interpretation, and sensors can be arranged according to the size of the steel wire rope.
2. In conventional detection schemes, magnetic sensor detection data describes the circumferential magnetic field distribution around a steel wire rope, a small damage signal is superimposed on a large background signal, and a reference sample (reference data) is required for comparison before the data interpretation. The detection method of the present invention directly detects changes in the spatial magnetic field gradient caused by the damage to the steel wire rope, without reference data or additional comparison sensors, and realizes description of the damage to the steel wire rope, so that the test result is more direct, and the data is more easily interpreted.
3. The present invention uses magnetoresistive sensors to form a probe of the magnetoresistive sensor array. While ensuring the detection sensitivity, the spatial resolution of damage detection approximately reaches the order of micrometers, which improves the capability for detection of a broken wire, a narrowed diameter, and deep damage.
4. The magnetoresistive sensor array of the present invention is tailorable and meets the needs of detecting damages to steel wire ropes of different sizes and other ferromagnetic materials.

DESCRIPTION OF THE DRAWINGS

In order to explain the embodiments of the present invention or the technical solutions in the prior art more clearly, the accompanying drawings that need to be used in the description of the embodiments or prior art will be introduced briefly below. Obviously, the accompanying drawings in the following description are only some embodiments of the present invention. For those of ordinary skill in the art, other accompanying drawings can further be obtained according to these accompanying drawings without creative efforts.

REFERENCE NUMERALS

1—lower shell, 2—buckle, 3—bushing, 4—upper shell, 5—electrical connector, 6—reed, 7—hinge, 8—countersunk screw, 9—air bag, 10—PCB, 11—pan-head screw, 12—positioning column, 13—positioning hole, 14—limiting groove, 15—steel wire rope to be tested, 16—guide wheel, 17—magnetoresistive sensor.

DETAILED DESCRIPTION

In order to make the objectives, technical solutions, and advantages of the embodiments of the present invention clearer, the technical solutions in the embodiments of the present invention will be described clearly and completely below with reference to the accompanying drawings in the embodiments of the present invention. It is apparent that the described embodiments are a part of, not all, the embodiments of the present invention.

Figure 1A:
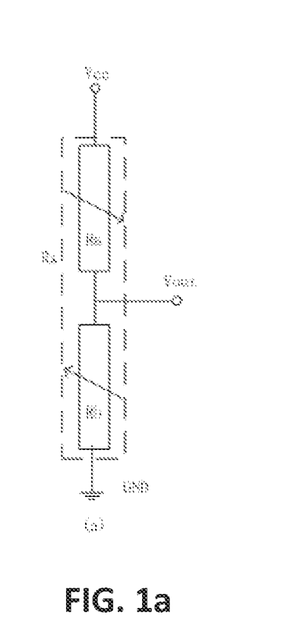
FIG. 1a is a schematic diagram of a magnetoresistive sensor with a half-bridge structure according to the present invention.
Figure 1B:
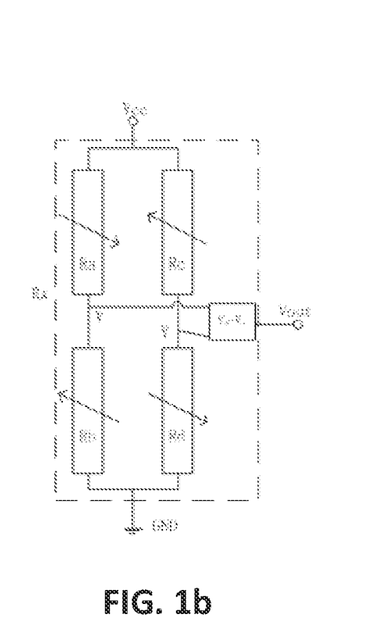
FIG. 1b is a schematic diagram of a magnetoresistive sensor with a full-bridge structure according to the present invention.
Figure 1C:
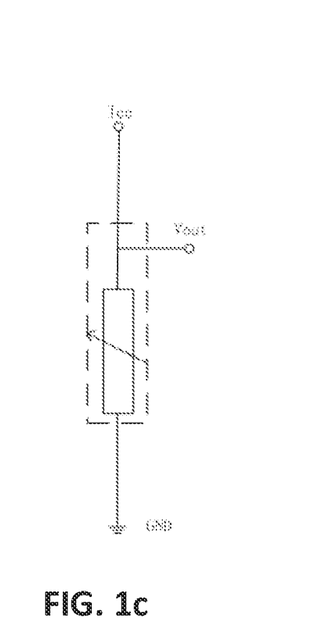
FIG. 1c is a schematic diagram of a magnetoresistive sensor with a single magnetoresistive structure according to the present invention.

Three basic detection units commonly used in the present invention for detecting a magnetic gradient field of damage to a steel wire rope are a magnetoresistive sensor with a half-bridge structure, a magnetoresistive sensor with a full-bridge structure, and a magnetoresistive sensor with a single magnetoresistive structure. FIG. 1a is a schematic diagram of a magnetoresistive sensor with a half-bridge structure according to the present invention, FIG. 1b is a schematic diagram of a magnetoresistive sensor with a full-bridge structure according to the present invention, and FIG. 1c is a schematic diagram of a magnetoresistive sensor with a single magnetoresistive structure according to the present invention. As shown in FIG. 1a to FIG. 1c, suppose that in the three structures, a resistance value of a single magnetoresistor is R, and a magnetoresistive change value is $\Delta R$:

As shown in FIG. 1a, the magnetoresistive sensor with the half-bridge structure is composed of a first magnetoresistor Ra and a second magnetoresistor Rb, wherein a resistance value of the first magnetoresistor Ra is Ra1, and a resistance value of the second magnetoresistor Rb is Rb1. Assuming Ra1=Rb1=R, a calculation formula of an output signal $V_1$ of the magnetoresistive sensor with the half-bridge structure is:

$$V_1 = \frac{Rb1 - \Delta R}{(Ra1 + \Delta R) + (Rb1 - \Delta R)} V_{cc} = \frac{R - \Delta R}{2R} V_{cc}$$

wherein Vcc is the input signal of the magnetoresistive sensor.

As shown in FIG. 1b, the magnetoresistive sensor with the full-bridge structure is composed of a third magnetoresistor Rn, a fourth magnetoresistor Rn, a fifth magnetoresistor Rp, and a sixth magnetoresistor Rq. A resistance value of the third magnetoresistor Rm is Rm1, a resistance value of the fourth magnetoresistor Rn is Rn1, a resistance value of the fifth magnetoresistor Rp is Rp1, and a resistance value of the sixth magnetoresistor Rq is Rq1. If Rm1=Rn1=Rp1=Rq1=R, a calculation formula of an output signal $V_2$ of the magnetoresistive sensor with the full-bridge structure is:

$$V_2 = V_+ - V_- = \frac{\Delta R}{R} V_{es}$$

wherein $V_+$ is a signal value of a connection end between the third magnetoresistor Rm and the fourth magnetoresistor Rn, V is a signal value of a connection end between the fifth magnetoresistor Rp and the sixth magnetoresistor Rq, and Vcc is the input signal of the magnetoresistive sensor Further, calculation formulas of $V_+$ and $V_-$ are respectively:

$$V_+ = \frac{Rn1 + \Delta R}{(Rm1 - \Delta R) + (Rn1 + \Delta R)} V_{cc} = \frac{R + \Delta R}{2R} V_{cc}$$

$$V_- = \frac{Rq1 - \Delta R}{(Rp1 + \Delta R) + (Rq1 - \Delta R)} V_{cc} = \frac{R - \Delta R}{2R} V_{cc}$$

As shown in FIG. 1c, the magnetoresistive sensor with a single magnetoresistive structure is composed of a seventh magnetoresistor Rd, wherein a resistance value of the seventh magnetoresistor Rd is Rd1. If Rd1=R, a calculation formula of an output signal $V_3$ of the magnetoresistive sensor with a single magnetoresistive structure is:

$$V_3 = (R + \Delta R) I_{cc}$$

wherein $I_{cc}$ is an input current of the magnetoresistive sensor with a single magnetoresistive structure.

Figure 2:
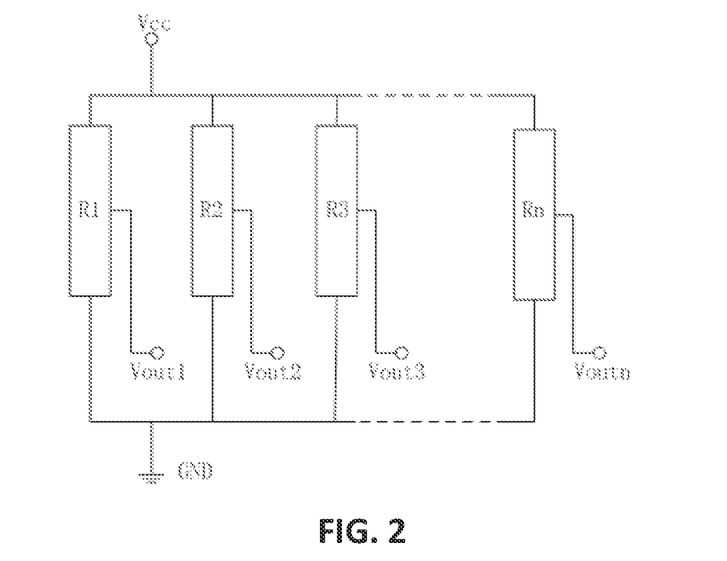
FIG. 2 is a schematic structural diagram of a magnetoresistive sensor array for detecting damage to a steel wire rope according to the present invention.

FIG. 2 is a schematic structural diagram of a magnetoresistive sensor array for detecting damage to a steel wire rope according to the present invention. As shown in FIG. 2, the magnetoresistive sensor array is composed of N magnetoresistive sensors, and every two adjacent magnetoresistive sensors form a magnetic field gradient sensor.

When the magnetic field is uniform, that is, when the steel wire rope is not damaged, outputs of various magnetoresistive sensors are consistent. For the magnetoresistive sensor with the half-bridge structure, the magnetoresistive sensor with the full-bridge structure, and the magnetoresistive sensor with the single magnetoresistive structure, there are a difference N between output signals of various magnetoresistive sensors being 0, and the calculation formula is:

$$V_n = V_{outn} - V_{outn+1} = 0$$

wherein $V_{outn}$ is an output signal of the $n^{th}$ magnetoresistive sensor, and $V_{outn+1}$ is an output signal of the $(n+1)^{th}$ magnetoresistive sensor.

When the magnetic field is not uniform, that is, when the steel wire rope is locally damaged, the local damage to the steel wire rope causes a gradient in the spatial distribution of the magnetic field at the damage position, and the output signals of various magnetoresistive sensors are related to distances from the damage position.

For a magnetoresistive sensor array composed of magnetoresistive sensors with a half-bridge structure as basic units, a calculation formula for a difference $V_{n1}$ between output signals of various magnetoresistive sensors is:

$$V_{n1} = \frac{R - \Delta R_n}{2R} V_{cc} - \frac{R - \Delta R_{n+1}}{2R} V_{cc} = \frac{\Delta R_{n+1} - \Delta R_n}{2R} V_{cc}$$

wherein $\Delta R_n$ is a magnetoresistance change value of the $n^{th}$ magnetoresistive sensor, and $\Delta R_{n+1}$ is a magnetoresistance change value of the $(n+1)^{th}$ magnetoresistive sensor.

For a magnetoresistive sensor array composed of magnetoresistive sensors with a full-bridge structure as basic units, a calculation formula for a difference $V_{n2}$ between output signals of various magnetoresistive sensors is:

$$V_{n2} = \frac{\Delta R_n}{R} V_{cc} - \frac{\Delta R_{n+1}}{R} V_{cc} = \frac{\Delta R_n + \Delta R_{n+1}}{R} V_{cc}$$

wherein $\Delta R_n$ is a magnetoresistance change value of the $n^{th}$ magnetoresistive sensor, and $\Delta R_{n+1}$ is a magnetoresistance change value of the $(n+1)^{th}$ magnetoresistive sensor.

For a magnetoresistive sensor array composed of magnetoresistive sensors with a single magnetoresistive structure as basic units, a calculation formula for a difference $V_{n3}$ between output voltages of various magnetoresistive sensors is:

$$V_{n3} = (\Delta R_n - \Delta_{n+1}) I_{cc}$$

wherein $\Delta R_n$ is a magnetoresistance change value of the n, magnetoresistive sensor, and $\Delta R_{n+1}$ is a magnetoresistance change value of the $(n+1)^{th}$ magnetoresistive sensor.

Figure 3:
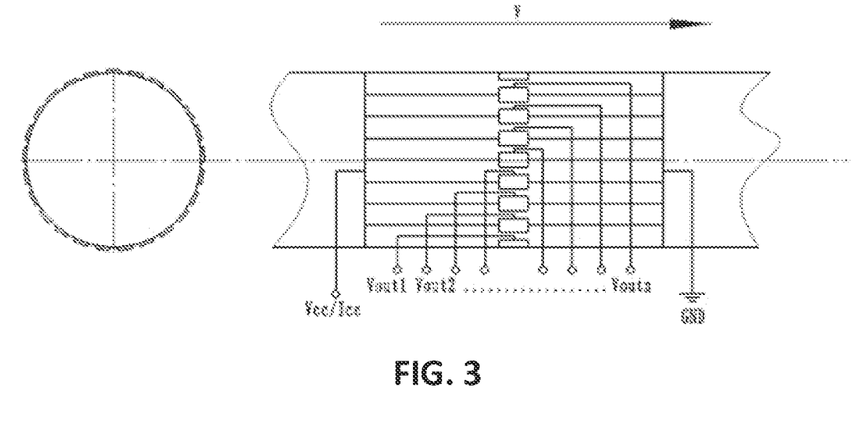
FIG. 3 is a schematic diagram of principles of non-destructive testing for detecting damage to a steel wire rope according to the present invention.

FIG. 3 is a schematic diagram of principles of nondestructive testing for detecting damage to a steel wire rope according to the present invention. As shown in FIG. 3, a magnetoresistive sensor array composed of N magnetoresistive sensors surrounds the steel wire rope in a circumferential direction. The magnetoresistive sensor array is formed by arranging a plurality of magnetoresistive sensors 17. When used in detection of damage to the steel wire rope, the magnetoresistive sensor array moves in an axial direction of the steel wire rope, and a differential signal is calculated using output values of every two adjacent magnetoresistive sensors to obtain a total of N differential signals, and the N differential signals reflect distribution of circumferential magnetic field gradient of the steel wire rope.

$$V_1 = V_{out1} - V_{out2}$$

$$V_2 = V_{out2} - V_{out3}$$

...

$$V_n = V_{outn} - V_{out1}$$

wherein $V_{out1}$ is an output value of the first magnetoresistive sensor, $V_{out2}$ is an output value of the second magnetoresistive sensor, $V_{out3}$ is an output value of the third magnetoresistive sensor, and $V_{outn}$ is an output value of the $n^{th}$ magnetoresistive sensor. $V_1$ is a differential signal of the output values of the first magnetoresistive sensor and the second magnetoresistive sensor. $V_2$ is a differential signal of the output values of the second magnetoresistive sensor and the third magnetoresistive sensor. $V_n$ is a differential signal of the output values of the first magnetoresistive sensor and the $n^{th}$ magnetoresistive sensor.

When the steel wire rope is damaged locally, the spatial magnetic field distribution in the circumferential direction of the steel wire rope changes abruptly at the damage position, that is, the spatial magnetic field at the damage position has a gradient. Using the relative position of the magnetoresistive sensor array and the size of the gradient field can realize the rapid positioning of the damage and assessment of the damage status.

Figure 4:
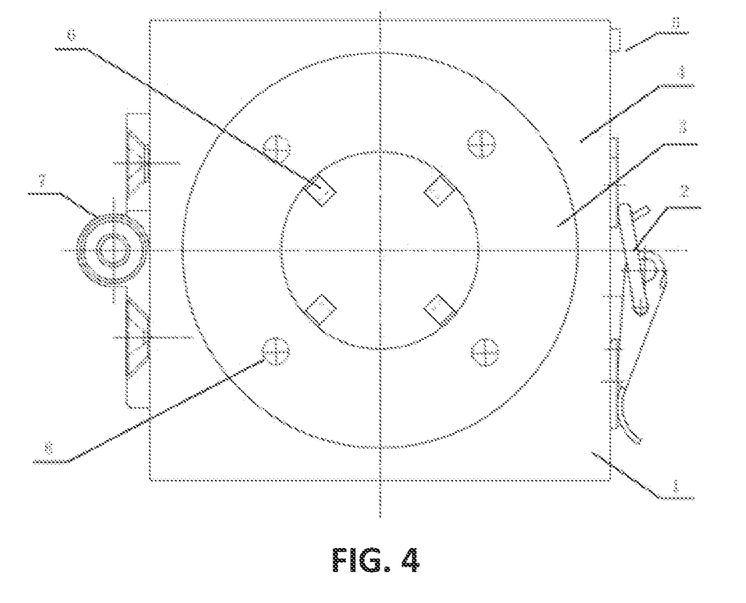
FIG. 4 is a side view of a non-destructive testing device for detecting damage to a steel wire rope according to the present invention.
Figure 5:
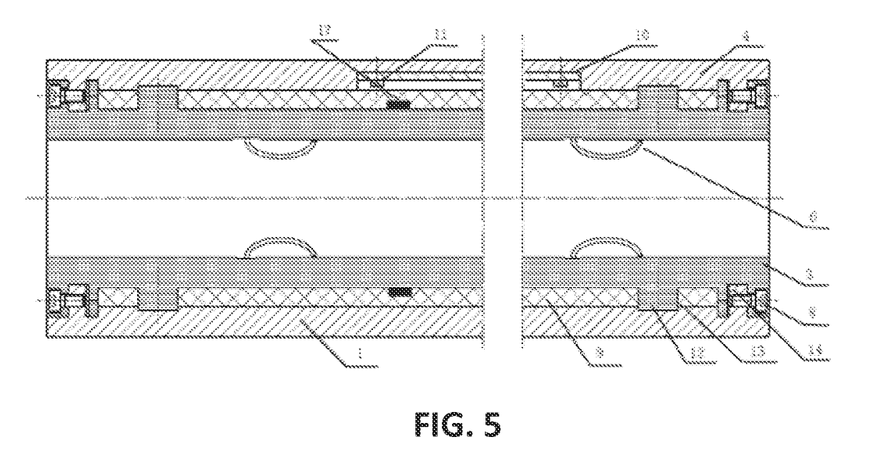
FIG. 5 is a cross-sectional view of a non-destructive testing device for detecting damage to a steel wire rope according to the present invention.
Figure 6:
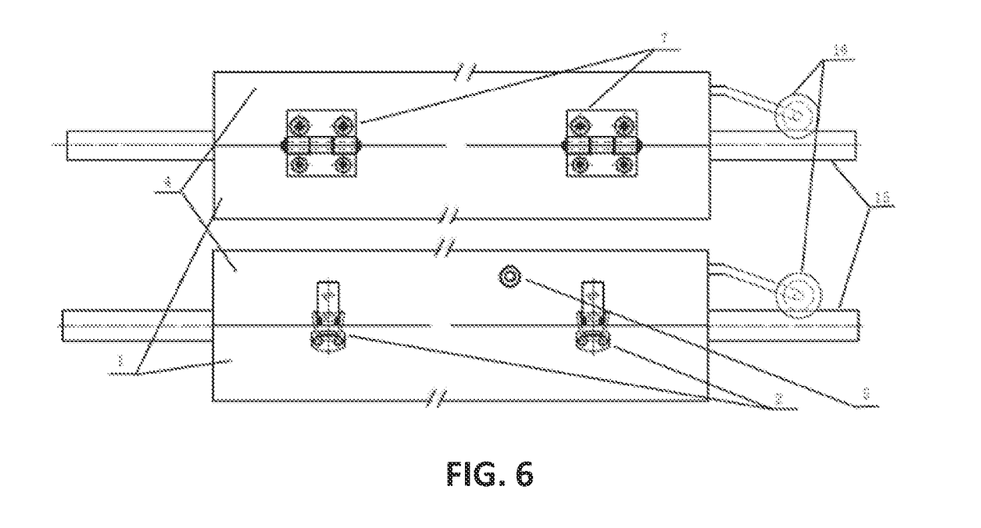
FIG. 6 is front and back views of a non-destructive testing device for detecting damage to a steel wire rope according to the present invention.

FIG. 4 is a side view of a non-destructive testing device for detecting damage to a steel wire rope according to the present invention, FIG. 5 is a cross-sectional view of a non-destructive testing device for detecting damage to a steel wire rope according to the present invention, and FIG. 6 is front and back views of a non-destructive testing device for detecting damage to a steel wire rope according to the present invention. With reference to FIG. 4 to FIG. 6, a non-destructive testing device for detecting damage to a steel wire rope according to the present invention includes lower shell 1, bushing 3, upper shell 4, electrical connector 5, air bag 9, PCB 10, and guide wheel 16, wherein bushing 3 limits lower shell 1 and upper shell 4 through a limiting groove, and lower shell 1 is connected to upper shell 4 via an opening and closing structure. Air bag 9 is wrapped around bushing 3, PCB 10 is fixed on upper shell 4 or lower shell 1, and PCB 10 is connected to guide wheel 16 through electrical connector 5.

A magnetoresistive sensor array composed of N magnetoresistive sensors is arranged inside air bag 9 and is uniformly arranged in a circumferential direction of bushing 3, steel wire rope 15 passes through the magnetoresistive sensor array, and when steel wire rope 15 moves, it drives guide wheel 16 to rotate and triggers the acquisition of a command. Guide wheel 16 is set with a position coder which is used to calculate a relative position of movement of the steel wire rope.

PCB 10 is connected to a single chip microcomputer via a peripheral interface, and the single chip microcomputer is used to calculate a differential signal of N adjacent magnetoresistive sensors and to determine whether steel wire rope 15 is damaged.

In this embodiment, bushing 3 is cylindrical, and lower shell 1 and upper shell 4 are respectively fixed on bushing 3 by a plurality of countersunk screws 8. PCB 10 is connected to the single chip microcomputer via the peripheral interface. The single chip microcomputer calculates a differential signal of data acquired by every two adjacent magnetoresistive sensors to obtain N differential signals. If at least two adjacent differential signals are narrow pulses, it is determined that steel wire rope 15 is damaged.

Further, the opening and closing structure includes buckle 2 and hinge 7. First connection parts of lower shell 1 and upper shell 4 are connected via buckle 2, and second connection parts of lower shell 1 and upper shell 4 are connected via hinge 7. Buckle 2 and hinge 7 are respectively fixed on lower shell 1 and upper shell 4 by countersunk screws.

Upper shell 4 and lower shell 1 are connected via the opening and closing structure, upper shell 4 and lower shell 1 are opened, steel wire rope 15 is installed therein, and upper shell 4 and lower shell 1 are then closed and fastened by buckle 2.

Further, PCB 10 is fixed on upper shell 4 or lower shell 1 by pan-head screws 11 through metallized through holes. PCB 10 is connected to electrical connector 5 via a twisted-pair cable, guide wheel 16 is connected to electrical connector 5 via, a twisted-pair shielded cable, and a shielding layer of the twisted-pair shielded cable is connected to upper shell 4 through pins of electrical connector 5.

The present invention further includes at least two sets of reeds 6, each set of reeds 6 is uniformly distributed along an inner surface of bushing 3 in the circumferential direction, one end of reed 6 is welded to the inner surface of bushing 3, and the other end of the reed is embedded in a groove opened on the inner surface of bushing 3. Further, the inner surface on which the groove is opened and the inner surface to which one end of reed 6 is welded are the same inner surface. Here, each set of reeds includes at least two reeds 6, and distances between adjacent sets of reeds 6 in an axial direction of the inner surface of bushing 3 are the same. In a specific embodiment of the present invention, the position, length, and depth of the groove can be selected according to actual needs. Inserting the other end of reed 6 into the groove opened on the inner surface of bushing 3 allows reed 6 to have a certain degree of displacement, so that steel wire ropes with different radii can be detected by the non-destructive testing device, and the non-destructive testing device can be used in a broader range.

In a specific embodiment of the present invention, bushing 3 is set with a plurality of positioning columns, air bag 9 is set with positioning holes corresponding to the positioning columns, and the positioning columns are inserted into the positioning holes.

Figure 7:
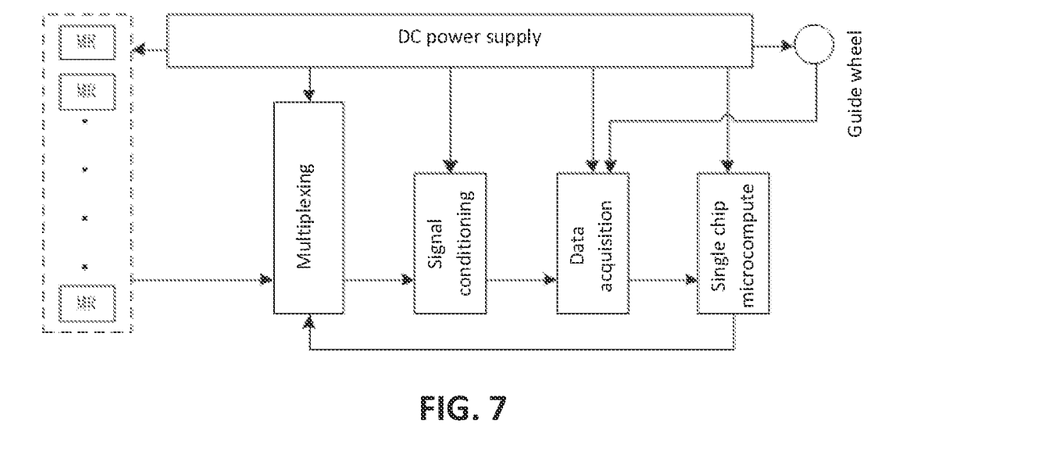
FIG. 7 is a block diagram of a signal processing circuit of a non-destructive testing device for detecting damage to a steel wire rope according to the present invention.

FIG. 7 is a block diagram of a signal processing circuit of a non-destructive testing device for detecting damage to a steel wire rope according to the present invention. As shown in FIG. 7, PCB 10 is integrated with a multiplexer and is used to output, via the multiplexer and in a preset order, information acquired by the magnetoresistive sensor array. The multiplexer of the present invention uses an ADG726 chip. The ADG726 chip is powered by −2.5V and +2.5V dual power supplies, and can be used as 32 single-ended channels and 16 differential channels, with signals that are allowed to pass having a voltage range of −2.5V to +2.5V. A 32-channel voltage attenuation network uses corresponding precision resistors with an error range of less than 1% to divide the voltage. The multiplexer transfers an acquired signal to a signal conditioning circuit composed of an operational amplifier. The operational amplifier of the present invention uses an AD620 chip. When the signal conditioning circuit completes signal conditioning, the signal is acquired by a data acquisition card and then processed and stored by a single chip microcomputer. The data acquisition card of the present invention uses NI PIXe-6368.

Working principles of the present invention are briefly introduced as follows.

Figure 8:
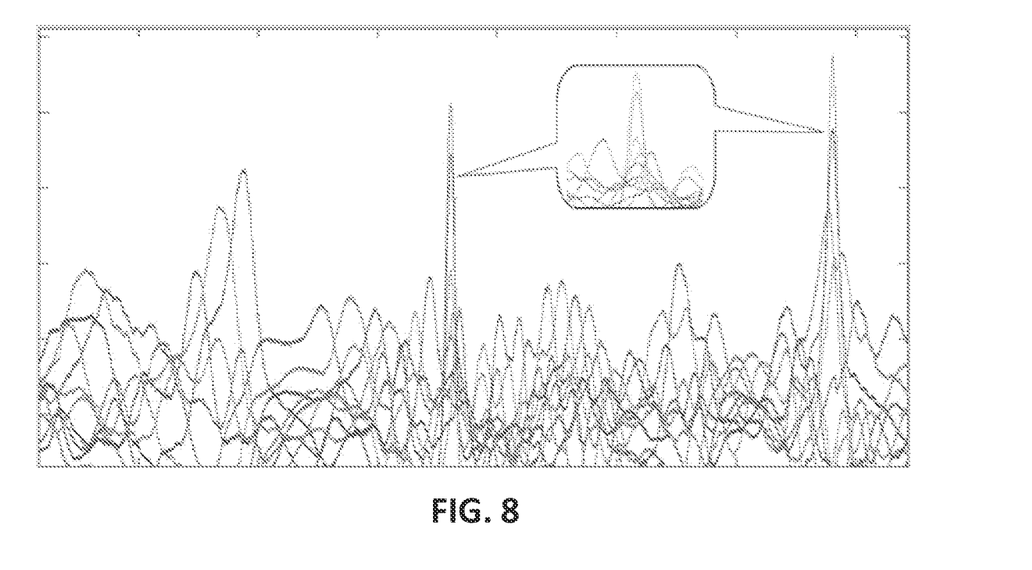
FIG. 8 is a waveform diagram of signal processing of a non-destructive testing device for detecting damage to a steel wire rope according to the present invention.

The non-destructive testing device for detecting damage to a steel wire rope is opened and fixed on steel wire rope 15 through buckle 2, and guide wheel 16 is attached to steel wire rope 15. According to detection requirements, a sampling rate, a detection speed, and a detection start position are set. Displacement of the non-destructive testing device with respect to the steel wire rope is detected, and the steel wire rope detection device is kept stable. Data of the magnetoresistive sensor array is acquired and stored in real time, and position data of guide wheel 16 is synchronously acquired and stored. The single chip microcomputer analyzes the acquired data in real time. FIG. 8 is a waveform diagram of signal processing of a non-destructive testing device for detecting damage to a steel wire rope according to the present invention. As shown in FIG. 8, when the steel wire rope is damaged, an output of a magnetic sensor passing through the damage is a narrow pulse, and when there are at least two sensors that output narrow pulses synchronously, it is determined as a damage signal; otherwise, it is determined as a false damage signal caused by jitter of the steel wire rope with respect to the non-destructive testing device.

The single chip microcomputer uses the sampling rate, the rotational speed of the guide wheel, and the acquisition time length to analyze the position data of the non-destructive testing device in real time and associate it with the damage data, converts time domain data of the detection sensor into data related to the position of the steel wire rope, and then locates the damage of the steel wire rope according to the detection data.

A radial position of the damage to the steel wire rope is positioned using the position information of the magnetoresistive sensor array; and a damage mode of the steel wire rope is determined according to the amplitude and pulse width of the damage detection data as follows: narrow-band pulses are determined as a LocaL Fault (LF), and pulses with relatively large pulse widths are determined as a Loss of Metallic Cross-Sectional Area (LMA). The LF includes rusting, abrasion, broken wire, etc. With continuous use, steel wire ropes will have different deterioration modes with various damage phenomena that reflect different use environments of the steel wire ropes. In fact, in the process of using a steel wire rope, the occurrence and development of damage to the steel wire rope are mutually affected. For example, the rusting of the steel wire rope will aggravate the abrasion damage, and the abrasion will promote the occurrence of broken wire. It is just that the speed and degree of damage development vary in various conditions of use.

The present invention uses the magnetic memory characteristic of the steel wire rope for damage detection, does not require an excitation mechanism, simplifies the structure of a detection probe, and is more convenient to operate. A magnetoresistive sensor for detecting a magnetic field gradient of damage to a steel wire rope is designed, and the sensor has a high magnetic field sensitivity on the order of petawatts and a magnetic field spatial resolution near the order of microns, thus improving the ability of detecting broken wires, smaller wire diameters, and deep damage of the steel wire rope. The magnetoresistive sensors are connected in parallel to form a probe of a magnetoresistive sensor array, and the number of magnetoresistive sensors forming the probe of the magnetoresistive sensor array can be tailored according to the size of the steel wire rope. The differential signals of adjacent magnetoresistive sensors are used to describe circumferential magnetic field gradient information surrounding the steel wire rope, and the detection results directly describe the damage status of the steel wire rope without any reference.

Based on the embodiments of the present invention, all other embodiments obtained by those of ordinary skill in the art without creative efforts shall fall within the protection scope of the present invention. Although the present invention has been illustrated and described in terms of preferred embodiments, those skilled in the art should understand that various changes and modifications can be made to the present invention as long as they do not exceed the scope defined by the claims of the present invention.

The invention claimed is:

1. A non-destructive testing device for detecting damage to a steel wire rope, comprising:
   a first shell;
   a bushing;
   an second shell;
   an electrical connector;
   an air bag;
   a PCB; and
   a guide wheel
   wherein
   the bushing limits the first shell and the second shell through a limiting groove, the first shell is connected to the second shell via an opening and closing structure, the air bag is wrapped around the bushing, the PCB is fixed on the second shell or the first shell, and the PCB is connected to the guide wheel through the electrical connector;
   a magnetoresistive sensor array composed of N magnetoresistive sensors is arranged inside the air bag and is uniformly arranged in a circumferential direction of the bushing, a steel wire rope passes through the magnetoresistive sensor array, and when the steel wire rope moves, it drives the guide wheel to rotate and triggers an acquisition of a command;
   the guide wheel is set with a position coder which is used to calculate a relative position of movement of the steel wire rope; and
   the PCB is connected to a single chip microcomputer via a peripheral interface, and the single chip microcomputer is used to calculate a differential signal of N adjacent magnetoresistive sensors and to determine whether the steel wire rope is damaged.

2. The non-destructive testing device for detecting damage to a steel wire rope according to claim 1, wherein the opening and closing structure comprises a buckle and a hinge;
   first connecting parts of the first shell and the second shell are connected via the buckle, and second connecting parts of the first shell and the second shell are connected via the hinge; and
   the buckle and the hinge are respectively fixed on the first shell and the second shell by countersunk screws.

3. The non-destructive testing device for detecting damage to a steel wire rope according to claim 1, wherein the PCB is fixed on the second shell or the first shell by pan-head screws through metalized through holes;
   the PCB is connected to the electrical connector via a twisted-pair cable, the guide wheel is connected to the electrical connector via a twisted-pair shielded cable, and a shielding layer of the twisted-pair shielded cable is connected to the second shell through pins of the electrical connector.

4. The non-destructive testing device for detecting damage to a steel wire rope according to claim 1, further comprising a number of reeds forming at least two sets of reeds, each set of reeds is uniformly distributed along an inner surface of the bushing in the circumferential direction, one end of a reed from the number of reeds is welded to the inner surface of the bushing, and an other end of the reed is embedded in a groove opened on the inner surface of the bushing.

5. The non-destructive testing device for detecting damage to a steel wire rope according to claim 4, wherein each set of reeds contains at least two reeds, and distances between adjacent sets of reeds in an axial direction of the inner surface of the bushing are equal.

6. The non-destructive testing device for detecting damage to a steel wire rope according to claim 1, wherein the bushing is set with positioning columns, the air bag is set with positioning holes corresponding to the positioning columns, and the positioning columns are inserted into the positioning holes.

7. The non-destructive testing device for detecting damage to a steel wire rope according to claim 1, wherein the PCB is integrated with a multiplexer and is used to output, via the multiplexer and in a preset order, information acquired by the magnetoresistive sensor array.

* * * * *